United States Patent [19]

Kosa et al.

[11] 4,373,249
[45] Feb. 15, 1983

[54] METHOD OF MANUFACTURING A SEMICONDUCTOR INTEGRATED CIRCUIT DEVICE

[75] Inventors: Yasunobu Kosa; Kazuhiro Komori, both of Kodaira, Japan

[73] Assignee: Hitachi, Ltd., Tokyo, Japan

[21] Appl. No.: 186,739

[22] Filed: Sep. 12, 1980

[30] Foreign Application Priority Data

Feb. 20, 1980 [JP] Japan .................. 55-18983

[51] Int. Cl.³ .............................. H01L 21/26
[52] U.S. Cl. .................. 29/571; 29/576 B; 29/577 C; 148/187
[58] Field of Search ........... 29/571, 576 B, 577 C; 148/1.5, 187

[56] References Cited

U.S. PATENT DOCUMENTS

| | | | |
|---|---|---|---|
| 4,013,489 | 3/1977 | Oldham | 148/187 X |
| 4,075,045 | 2/1978 | Rideout | 148/187 |
| 4,085,498 | 4/1978 | Rideout | 148/187 X |
| 4,123,300 | 10/1978 | Joshi et al. | 148/187 |
| 4,142,926 | 3/1979 | Morgan | 148/187 |
| 4,178,674 | 12/1979 | Liu et al. | 29/571 |
| 4,180,826 | 12/1979 | Shappir | 29/571 X |
| 4,183,040 | 1/1980 | Rideout | 148/187 X |
| 4,326,329 | 4/1982 | McElroy | 29/571 |

*Primary Examiner*—G. Ozaki
*Attorney, Agent, or Firm*—Kenyon & Kenyon

[57] ABSTRACT

A semiconductor integrated circuit device, especially an EPROM (Electrically Programmable Read Only Memory) device which consists of an MIS type memory transistor portion having a floating gate electrode and a control gate electrode on said floating gate electrode, and of an MIS type transistor portion having a gate electrode is formed by patterning the same conductor layer as the floating gate electrode in the periphery of said MIS type memory transistor portion.

7 Claims, 18 Drawing Figures

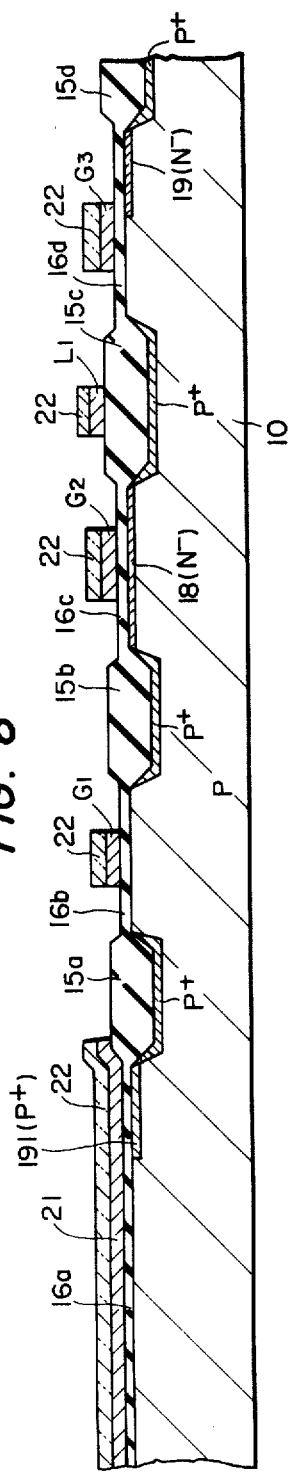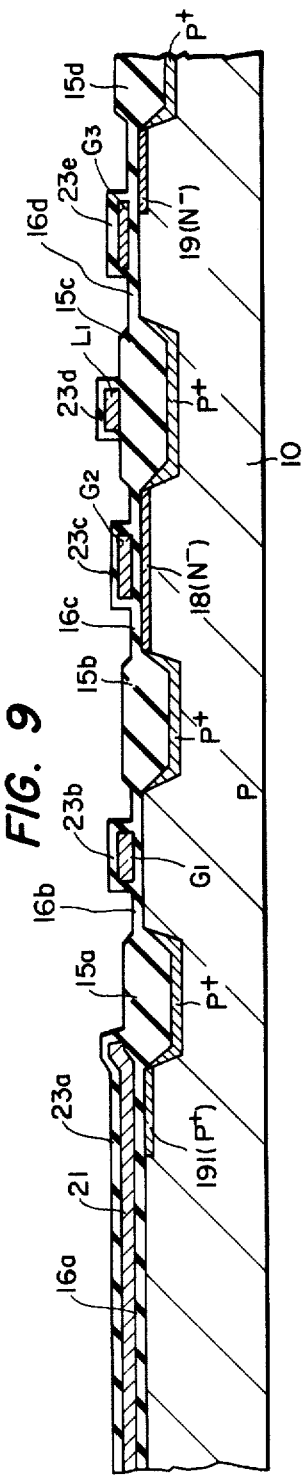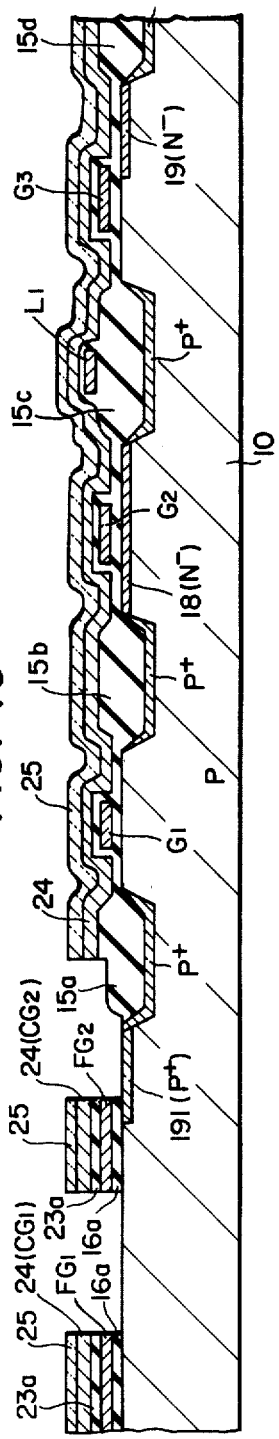

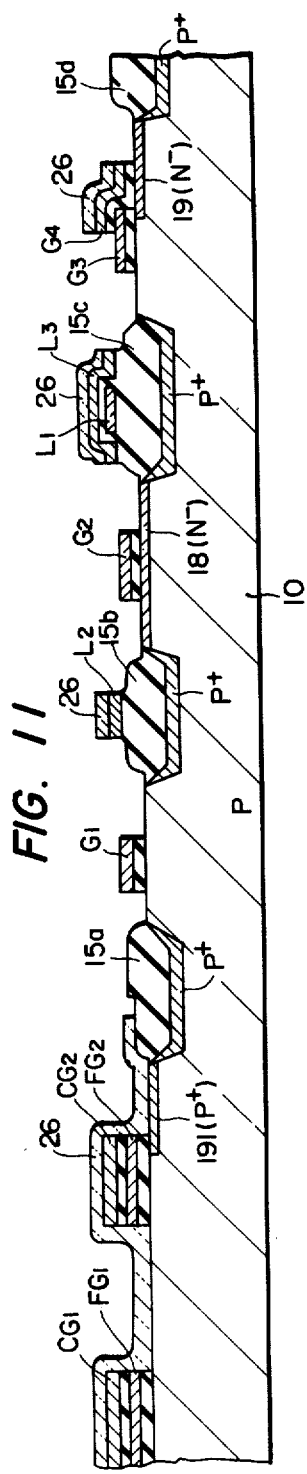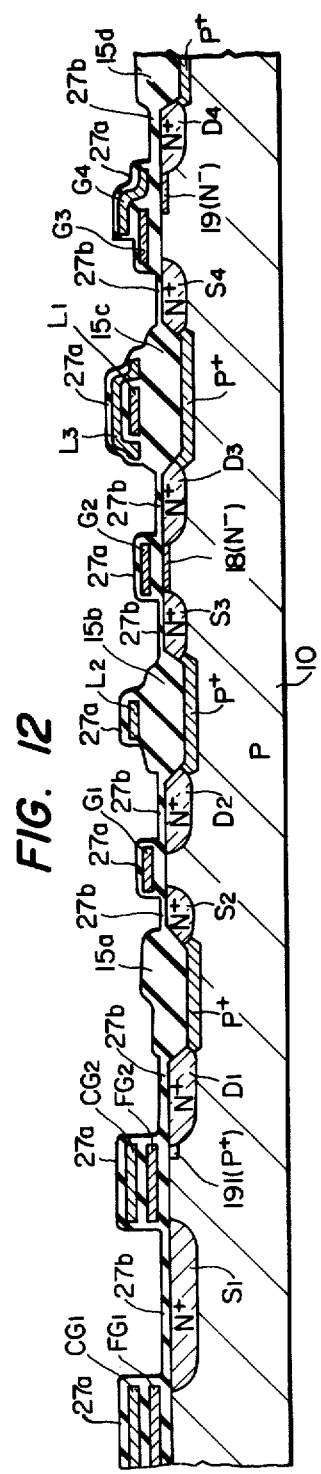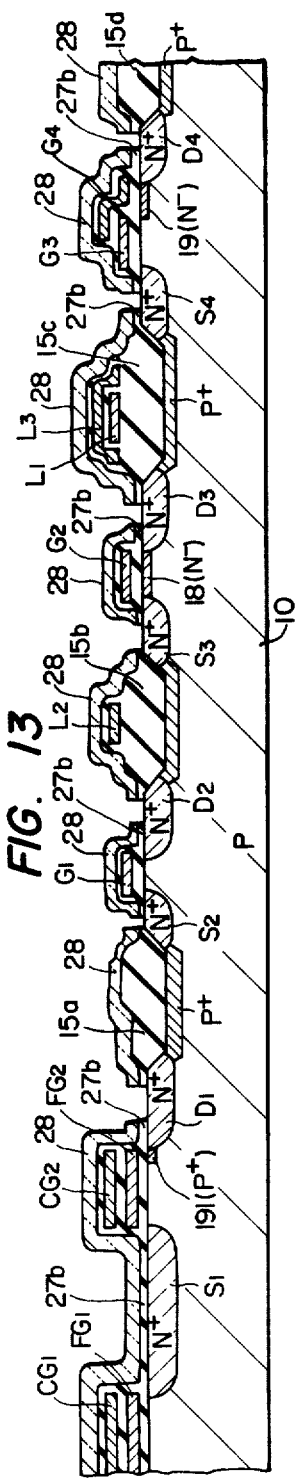

METHOD OF MANUFACTURING A SEMICONDUCTOR INTEGRATED CIRCUIT DEVICE

BACKGROUND OF THE INVENTION

This invention relates to a semiconductor integrated circuit device and more specifically to an EPROM (Electrically Programmable Read Only Memory) device and to a method of manufacturing such a device.

Most ordinary EPROM devices comprise a memory array portion consisting of plural MIS (Metal-Insulator-Semiconductor) type memory transistors, each having a floating gate electrode, formed on the main surface of a semiconductor substrate, for storing charges and a control gate electrode formed on the gate electrode, and a peripheral circuit portion consisting of an input-output circuit and a decoder circuit consisting of plural MIS type transistors (hereinafter called "peripheral transistors"), formed in the periphery of the memory array portion.

In an EPROM device, conditions for forming the gate electrodes of the memory transistors and peripheral transistors are decisive factors for obtaining stable performance characteristics and for realizing high density of integration.

The present invention has been devised paying specific attention to the conditions for the formation of the gate electrodes.

SUMMARY OF THE INVENTION

It is an object of the present invention to provide a semiconductor integrated circuit device which has stable characteristics and also has a novel structure which leads to high density integration.

It is another object of the present invention to provide a novel fabrication method for the purpose of obtaining the above-mentioned semiconductor integrated circuit device.

The novel semiconductor integrated circuit device in accordance with the present invention is characterized by including MIS type memory transistors, each having a floating gate electrode and a control gate electrode formed on the floating gate electrode, and MIS type transistors (peripheral transistors), each formed in the periphery of the MIS type memory transistors which are also possessed of a gate electrode which is obtained by patterning the same conductor layer as is used to obtain the floating gate electrode.

BRIEF DESCRIPTION OF THE DRAWINGS

FIGS. 2 through 15 are sectional views showing the steps of the fabrication method of an EPROM device in accordance with the present invention.

DESCRIPTION OF THE PREFERRED EMBODIMENTS

The present invention will now be explained more concretely.

Figure 1:
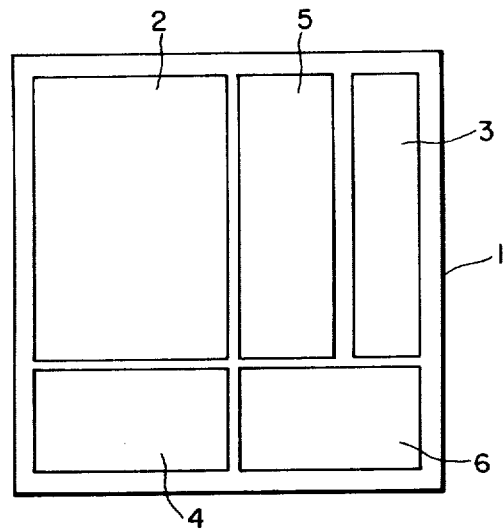
FIG. 1 is a schematic plan view of the EPROM device in accordance with the present invention.

Referring initially to FIG. 1 which shows schematically and illustrates the EPROM device of the present invention, reference numeral 1 designates a semiconductor substrate (semiconductor pellet) consisting of single crystalline silicon. A memory array portion 2 consisting of plural memory transistors having the above-described structure and arranged in a matrix is formed on a part on the main surface of this substrate 1. In the periphery of this array portion 2 are arranged an input circuit portion 3, an output circuit portion 4, a decoder circuit portion 5 and an other logic circuit portion 6 that consist of depletion type MIS transistors, enhancement type MIS transistors, enhancement type MIS transistors having a high breakdown voltage structure, and so forth.

Figure 2:
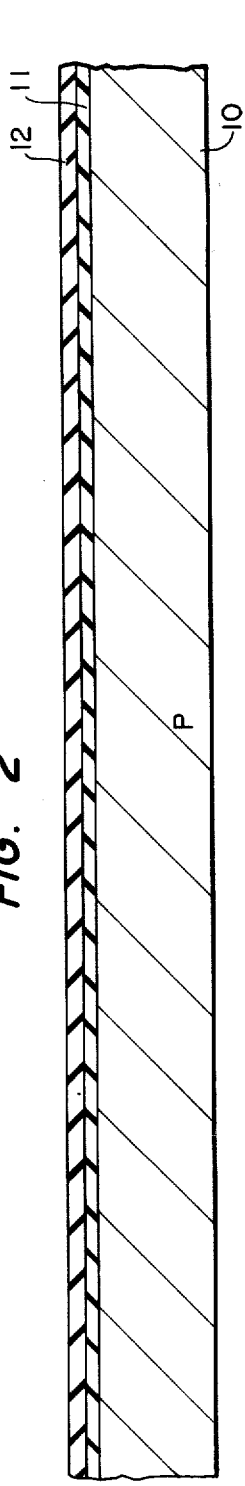

The fabrication method of the above-mentioned EPROM device will now be explained by referring to the sectional views of FIGS. 2 through 15, each showing a step in the fabrication of the EPROM device. The steps are as follows:

(a) Referring first to FIG. 2, the surface of a P-type single crystalline silicon (Si) substrate 10 is oxidized at an elevated temperature to form a 1000 Å thick silicon dioxide ($SiO_2$) film 11. On the surface of this $SiO_2$ film a silicon nitride ($Si_3N_4$) film 12 having a thickness of about 1500 Å is formed.

Figure 3:
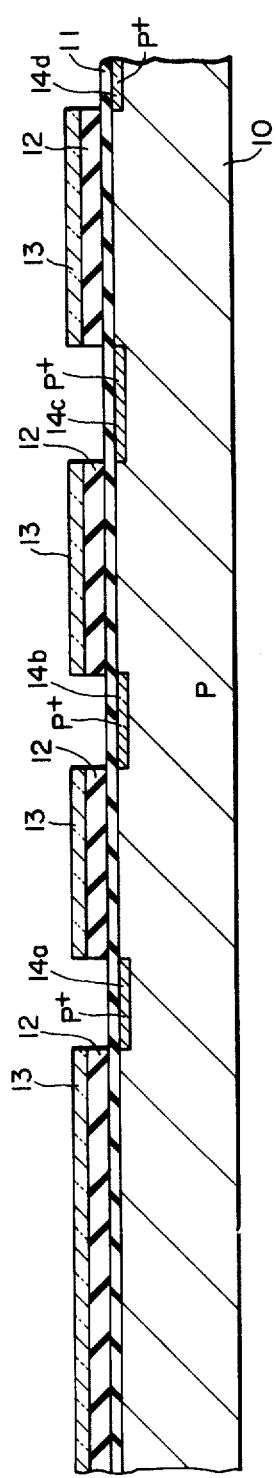

(b) As shown in FIG. 3, the $Si_3N_4$ film 12 is selectively removed by etching using a photoresist film 13 as a mask in order to permit forming a P+ type channel stopper, which is to function as an insulation-isolation portion, in the surface of the substrate 10. Thereafter, an impurity, such as boron impurity, which establishes a P-type region for example, is introduced into the substrate 10 through the $SiO_2$ 11 by ion implantation, thereby forming P+ type channel stoppers 14a, 14b, 14c and 14d. The P+ channel stoppers prevent the surface of the substrate from being changed into an N type.

Figure 4:
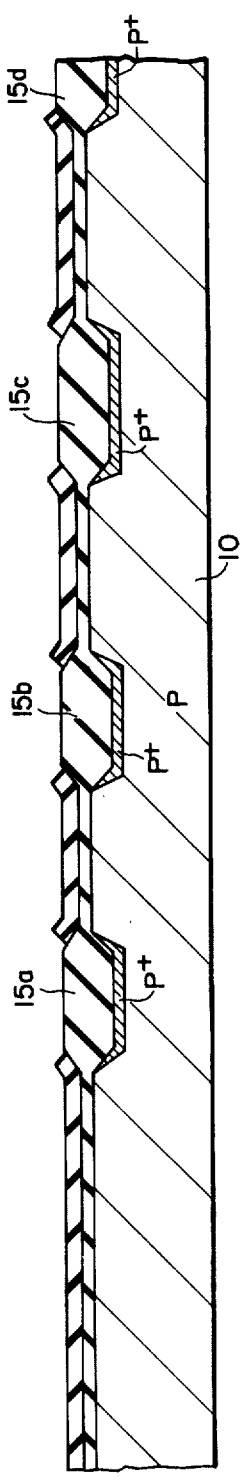
Figure 5:
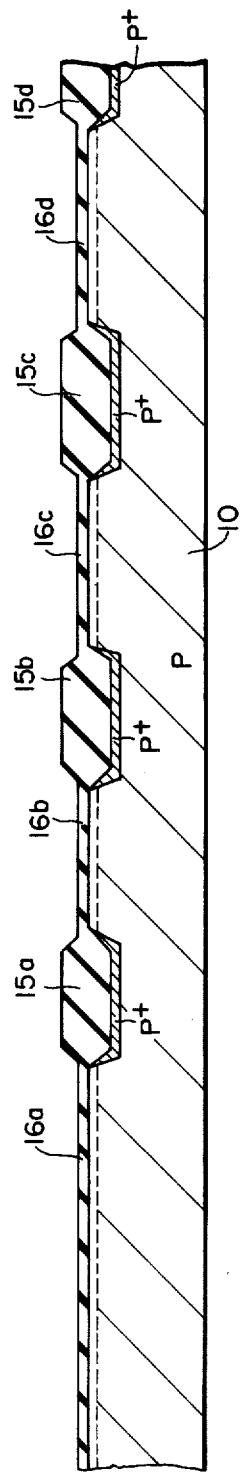

(c) As shown in FIG. 4, after the photoresist film 13 is removed, the substrate 10 is heated in an oxidizing atmosphere. Due to this heat treatment, the surface of the substrate 10 at the portions where $Si_3N_4$ is not formed (i.e., P+ channel stoppers 14a, 14b, 14c, 14d) are oxidized thereby to form an approximately 12,000 Å thick $SiO_2$ film for insulation-isolation (hereinafter called the field $SiO_2$ film) in areas 15a, 15b, 15c, and 15d. The $Si_3N_4$ film 12 and the underlying $SiO_2$ film 11 are completely removed to expose the surface of the substrate 10, and the surface of the substrate 10 thus exposed is then heat-oxidized thereby to form approximately 800 Å thick gate $SiO_2$ films 16a, 16b, 16c, 16d as shown in FIG. 5. Boron is then introduced into the surface of the substrate 10 through the gate $SiO_2$ films 16a, 16b, 16c, and 16d by the ion implantation method in order to control the threshold voltage levels of the memory transistor and peripheral transistor and especially that of the enhancement type transistor to desired voltage levels. In this instance, the implantation energy is about 70 KeV. In addition, since the field $SiO_2$ films 15a, 15b, 15c, 15d are formed to a sufficient thickness as mentioned above, boron is not introduced into the surface of the substrate 10 immediately underlying the field SiO$_2$ film. Accordingly, formation of a photoresist film at this step is not at all necessary.

Figure 6:
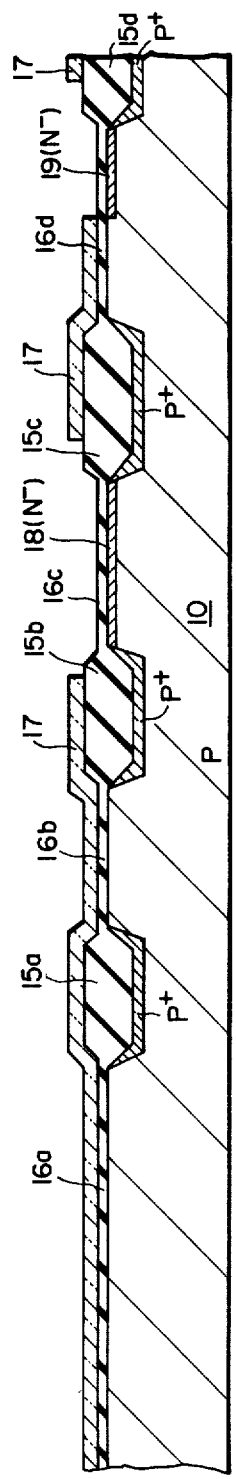

(e) As shown in FIG. 6, using a photoresist film 17 as a mask, an impurity such as phosphorus, for example, which establishes an N-type region is introduced by the ion implantation method into a part of the surface of the substrate 10, where the depletion type MIS transistor is to be formed, and into a part of the surface of the substrate 10, where the enhancement MIS transistor having a high breakdown voltage is to be formed, through the gate SiO$_2$ films 16c and 16d, thereby forming an N- type channel region 18 and an N- type region 19, respectively. The ion implantation energy is suitably about 120 KeV. The surface impurity concentration in these regions 18 and 19 is about $10^{12}$ atoms/cm$^2$.

Figure 7:
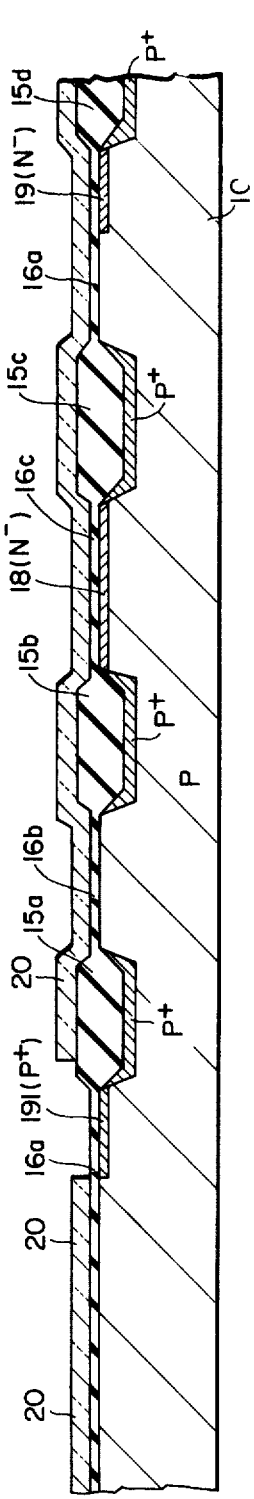

(f) As shown in FIG. 7, using a photoresist film 20 as a mask, boron is introduced by the ion implantation method into a part of the surface of the substrate 10, where the memory transistor is to be formed, through the gate SiO$_2$ film 16a thereby to form a P+ type region 191. The ion implantation energy is suitable about 70 KeV. The surface impurity concentration of the P+ type region 191 thus formed is about $10^{12}$ atoms/cm$^2$. This P+ type region 191 is formed in order to increase the programing efficiency of the EPROM device.

(g) As shown in FIG. 8, after the photoresist film 20 is removed, a 3,500 Å thick polycrystalline silicon layer 21 is formed by a CVD (Chemical Vapor Deposition) method to form the floating gate electrode of the memory transistor, the gate electrodes of the peripheral transistors and a necessary wiring layer. This polycrystalline silicon layer 21 is selectively etched (patterned) using a photoresist 22 as a mask, thereby forming the gate electrodes G1, G2, and G3 of the peripheral transistors and the wiring layer L1. Part of this same silicon layer used to form gates G1, G2 and G3 will later form, floating gates as will be described below in connection with FIG. 10. No impurity which permits or establishes electrical conduction is allowed to exist in the polycrystalline silicon layer 21, in the gate electrodes G1, G2 and G3 and in the wiring layer L1. If any impurity is present in the polycrystalline silicon layer 21 before the patterning of the latter, contamination is apt to occur at the step of depositing the photoresist film 22, at the step of the selective removal of the photoresist film 22 and at the step of the patterning of the polycrystalline silicon layer 21, thus adversely affecting the memory retention property of the memory transistor. The above-mentioned arrangement is employed to prevent this problem.

(h) As shown in FIG. 9, after the photoresist film 22 is removed, phosphorus impurity is introduced into the polycrystalline silicon layer 21, at the locations of the gate electrodes G1, G2, G3 and the wiring layer L1 so that the layers and electrodes will have a low resistance. Thereafter, the substrate 10 is heat treated in an oxidizing atmosphere. As a result, the surfaces of the polycrystalline silicon layer 21, gate electrodes G1, G2, and G3 and wiring layer L1 are oxidized whereby 1600 Å thick SiO$_2$ films 23a, 23b, 23c, 23d, and 23e are formed on these layers and electrodes. These SiO$_2$ films function as the inter-layer insulator.

(i) A second polycrystalline silicon layer 24 is formed by the CVD method on the substrate 10 under the state shown in FIG. 9. This polycrystalline silicon layer 24 has a thickness of about 3,500 Å. Again, no impurity which permits electrical conductivity is present in this polycrystalline silicon layer 24. Thereafter, as shown in FIG. 10, the polycrystalline silicon layer 24, the SiO$_2$ film 23a, the polycrystalline silicon layer 21 and the gate SiO$_2$ film 16a are sequentially and selectively etched (patterned) using a photoresist film 25 as a mask, thereby forming the control gate electrodes CG1, and CG2 and, therebelow; of the same layer as was used to form gates G1, G2, and G3, floating gate electrodes FG1, and FG2 of the memory transistor.

(j) As shown in FIG. 11, after the photoresist film 25 is removed, phosphorus is further introduced into the polycrystalline silicon layer 24 and into the control gate electrodes CG1 and CG2. Using a photoresist film 26 formed afresh as a mask, the polycrystalline silicon layer 24 is selectively patterned, thereby forming wiring layers L2 and L3 for the mutual connection between the peripheral transistors and an offset gate electrode G4 for the MIS type transistor having a high breakdown voltage. The further exposed SiO$_2$ films 23b, 23c, 23e and gates SiO$_2$ films 16b, 16c, 16d are etched completely.

(k) As shown in FIG. 12, after the photoresist film 26 is removed, phosphorus is deposited into the exposed surface of the substrate 10 and extension diffusion is effected thereby to form source regions S1, S2, S3, and S4 and drain regions D1, D2, D3 and D4. The depth of these regions is 1 u and the surface impurity concentration is $10^{15}$ atoms/cm$^2$. Further, the surfaces of the gate electrodes (CG1, CG2, G1, G2, G3, and G4), wiring layers (L2, and L3), source regions (S1, S2, S3, and S4) and drain regions (D1, D2, D3, and D4), that are exposed, are oxidized at a low temperature of 800° C. (at which these regions are not extended) in the oxidizing atmosphere. The thickness of the SiO$_2$ films 27a, and 27b formed on the surfaces of these electrodes, wiring layers and regions is about 1,200 Å.

(l) As shown in FIG. 13, using a photoresist 28 as a mask, the SiO$_2$ film 27b on the source region and drain regions is selectively etched.

Figure 14:
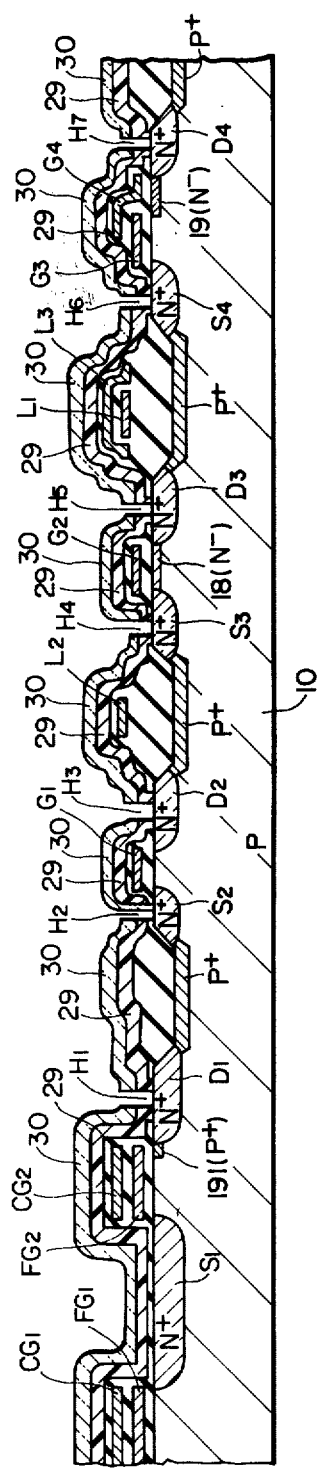

(m) As shown in FIG. 14, after the photoresist film 28 is removed, a phosphosilicate glass (PSG) film 29 is formed on the substrate 10. The thickness of this PSG film 29 is about 6,000 Å. Using a photoresist film 30 as a mask, the PSG film 29 is selectively etched, thereby forming contact holes H1, H2, H3, H4, H5, H6, H7.

Figure 15:
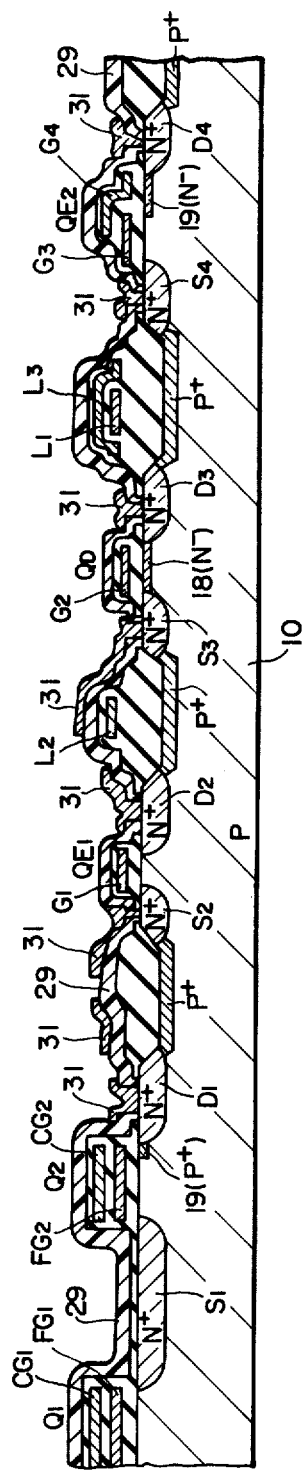

(n) As shown in FIG. 15, after the photoresist film 30 is removed, aluminum is vaporized onto the substrate 10. This aluminum is patterned to thereby form wiring layers 31. Although not shown in the drawing, the gate electrodes G3, and G4 of the enhancement type MIS transistor having a high breakdown voltage are mutually connected by the above-mentioned aluminum wiring layer.

As mentioned above, according to the method of the present invention, there are formed the memory transistors Q1, and Q2, the enhancement type MIS transistor QE1 as the peripheral transistor, the depletion type MIS transistor QD and the enhancement type MIS transistor QE2 having a high breakdown voltage.

Next, the action and effect of the present invention will be explained as follows.

As can be appreciated from the above-mentioned embodiment, the floating gate electrodes, FG1 and FG2 and the gate electrodes G1, G2 and G3 of the peripheral transistors are formed by patterning the polycrystalline silicon layer (conductor layer) of the first layer. Accordingly, the present invention provides an EPROM device having more stable characteristics in comparison with an EPROM device which has a peripheral transistor structure in which the second polycrystalline silicon layer is used as the gate electrode, which is the same as is used for the control gate electrode of the memory transistor, for example. Namely, in the above-mentioned prior art structure, the impurity such as phosphorus, which is contained in the first polycrystalline silicon layer and is deposited for the formation of the floating gate electrode of the memory transistor, diffuses out during the formation of the gate oxide film of the memory transistor and comes into the substrate of the peripheral transistor. For this reason, variance in a threshold voltage (Vthz) occurs between the resulting plural peripheral transistors. In the transistor structure of the present invention, on the other hand, this problem is eliminated because the gate electrode is formed by the first polycrystalline silicon layer.

Since the gate electrode of the peripheral transistor is formed by the first polycrystalline silicon layer, connection between the transistors in the second polycrystalline silicon layer is facilitated and it is thus possible to obtain an EPROM device of a structure having a high density of integration. It is possible, for example, to form a number of structures in which the wiring layer L1 crosses the wiring layer L2, in the peripheral circuit portion as shown in FIG. 15.

The polycrystalline silicon is specifically employed as the gate electrode and wiring layers. This polycrystalline silicon has high adhesion to the insulating film such as the $SiO_2$ film and does not form cut portions especially at the step portions of the $SiO_2$ film. Further, this polycrystalline silicon is easily converted into the $SiO_2$ film when oxidized in the oxidizing atmosphere. Accordingly, the insulation between the wirings can easily be accomplished by this $SiO_2$ film.

As explained in the step (e), the impurity (phosphorus) is implanted into the first polycrystalline silicon layer of the portion forming the memory transistor, into the gate electrode after the formation of the gate electrode of the peripheral transistor and into the wiring layer after the formation of the gate electrode of the peripheral transistor and the wiring layer. In other words, the first polycrystalline silicon layer is subjected to the phosphorus treatment. Since the phosphorus treatment is not carried out at the stage of the treatment of the first polycrystalline silicon layer which is effected for the purpose of forming the gate electrode of the peripheral transistor and the wiring layer, the first polycrystalline silicon layer at the portion forming the memory transistor is not easily contaminated. Consequently, a stable $SiO_2$ film is formed on the surface of this polycrystalline silicon layer, thereby yielding a memory transistor having a stable memory retention property.

Especially in forming the high breakdown voltage enhancement type MIS transistor QE2, the offset gate electrode can be formed without increasing the number of man-hours for the fabrication in particular. Furthermore, the N- type region can be formed simultaneously with the formation of the channel region of the depletion type MIS transistor. It is thus possible to readily obtain the enhancement type MIS transistor QE2 having a high breakdown voltage.

Next, modified embodiments of the present invention will be explained as follows.

Figure 16:
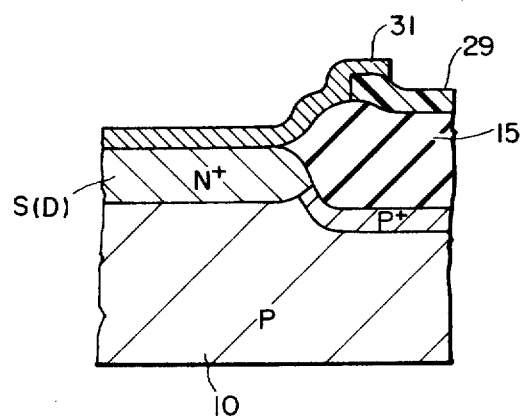
FIG. 16 is a partial sectional view of an EPROM device in accordance with another embodiment of the present invention.

The contact portion between the source region S (drain region D) and the wiring layer 31 in the memory transistor or the peripheral transistor can be formed in a structure such as shown in FIG. 16. For, since the thick field $SiO_2$ film 15 exists below the PSG film 29, the contact hole of the PSG film 29 can be formed with sufficient allowance.

In the peripheral transistor portion, high density integration of the EPROM device can be realized by extending the electrodes of the source region and the drain region using the second polycrystalline silicon layer. In this case, the photoresist processing step for selectively exposing the substrate 10 is necessary immediately before the aforementioned step (g).

Figure 17:
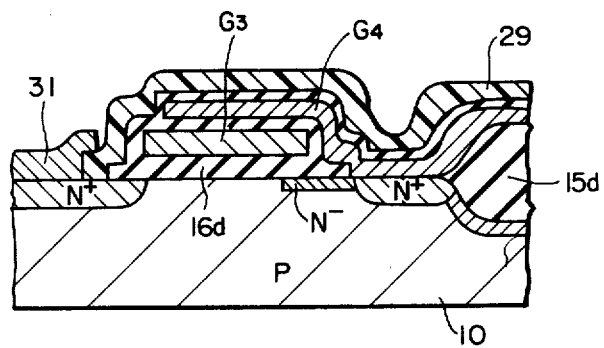
FIGS. 17 and 18 are partial sectional views of an enhancement type MIS transistor having a high breakdown voltage in accordance with another embodiment of the present invention.
Figure 18:
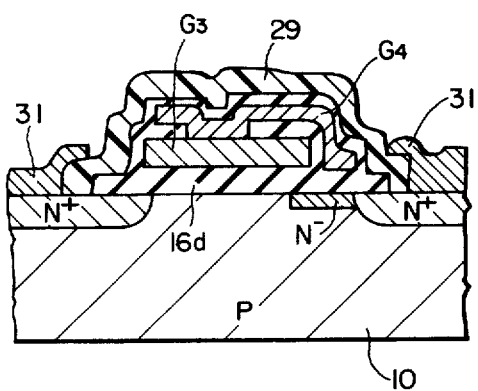

The gate structure (G3 and G4) of the gate electrodes of the enhancement type MIS transistor QE2 may be of such a type as shown in FIG. 17 or 18. In these drawings, the offset electrode G4 is formed by patterning the second polycrystalline silicon layer.

The second polycrystalline silicon layer may be replaced by a conductor layer consisting of a metallic material such as molybdenum, for example. Since molybdenum is a metal having a high melting point, it can play the role of the impurity mask in forming the source-drain region. The wiring layer formed by such a metallic material has a sheet resistance lower than that of the wiring layer consisting of the polycrystalline silicon and it can improve the switching speed of the EPROM device.

What is claimed is:

1. A method of a fabricating a semiconductor integrated circuit device comprising the steps of:
    simultaneously forming first and second gate insulation films at one part and another part of the main surface of a first conductivity type semiconductor substrate, respectively;
    forming a conductor layer on said first and second gate insulation films and patterning said conductor layer thereby to form first and second gate electrodes;
    forming an insulation film on said first gate electrode;
    forming a third gate electrode on said insulation film of said first gate electrode; and
    introducing into said substrate an impurity which determines a second conductivity type exhibiting the opposite conductivity to said first conductivity type thereby to form source and drain regions.

2. The method of fabricating a semiconductor integrated circuit device as defined in claim 1 wherein said first gate electrode and said third gate electrodes are formed as a floating gate and a control gate of a memory transistor portion, respectively, and said second gate electrode is formed as a gate electrode of a peripheral transistor portion.

3. The method of fabricating a semiconductor integrated circuit device as defined in claim 1 wherein each of said gate electrodes consists of a polycrystalline silicon layer.

4. The method of fabricating a semiconductor integrated circuit according to claim 1 further including forming a first wiring layer when patterning said conductor layer.

5. The method of fabricating a semiconductor integrated circuit according to claim 4 wherein said third gate electrode is formed by patterning a further conductor layer and further including patterning said further conductor layer to form second and third wiring layers.

6. The method of fabricating a semiconductor integrated circuit device according to claim 5 comprising forming said conductor layer and further conductor layer by chemical vapor deposition to obtain polycrystalline silicon layers without impurities which permit electrical conductivity, and, after patterning said layer and further layer, respectively, to form said gates, introducing an impurity into said patterned polycrystalline layer which will cause said layer to have a low resistance.

7. A method of fabricating a semiconductor integrated circuit comprising:
   (a) oxidizing the surface of a P type single crystalline substrate to form a silicon dioxide film and forming a silicon nitride film on the silicon dioxide film;
   (b) selectively etching the silicon nitride film and introducing an impurity through the silicon dioxide to form P+ channel stoppers;
   (c) oxidizing the areas which were selectively etched to form a silicon dioxide field film at each of said areas;
   (d) removing the remaining silicon nitride and underlying silicon dioxide films and again oxidizing said substrate to form silicon dioxide gate films;
   (e) introducing an impurity into the substrate through said gate films to control the threshold voltage levels;
   (f) introducing an impurity which will establish an N type region into the part of the surface where it is desired to form depletion MIS transistors and enhancement MIS transistors with a high break down voltage;
   (g) introducing an impurity which will form a P+ region into the part of the substrate where memory transistors are to be formed;
   (h) forming a first polycrystalline layer over the silicon dioxide layer on said substrate;
   (i) selectively etching said polycrystalline layer to form the gates of the peripheral transistors and a first wiring layer;
   (j) introducing an impurity which will increase conductivity into said gates and first wiring layer;
   (k) oxidizing said substrate to form silicon dioxide films over said gates and wiring layers;
   (l) forming a second polycrystalline layer on said substrate and etching said layer and said underlying silicon dioxide and first polycrystalline layers to form control gate electrodes and floating gate electrodes for the memory transistors;
   (m) introducing an impurity which will increase conductivity into said control gate electrodes;
   (n) further etching said second polycrystalline layer to form second and third wiring layers and to form an offset gate electrode for the MIS transistor with high breakdown voltage;
   (o) introducing an impurity to form source and drain regions for the transistors;
   (p) etching the silicon dioxide film over the source and drain regions;
   (q) forming a phosphosilicate glass film on said substrate;
   (r) etching said glass film to form contact holes to said source and drain regions; and
   (s) vaporizing a patterned metal onto said substrate and into said contact holes.

* * * * *